United States Patent [19]
Vanderbilt

[11] Patent Number: 5,257,301
[45] Date of Patent: Oct. 26, 1993

[54] DIRECT DIGITAL FREQUENCY MULTIPLIER

[75] Inventor: Paul E. Vanderbilt, San Diego, Calif.

[73] Assignee: TRW Inc., Redondo Beach, Calif.

[21] Appl. No.: 860,467

[22] Filed: Mar. 30, 1992

[51] Int. Cl.[5] .............................................. H03K 3/78
[52] U.S. Cl. ........................................ 377/47; 377/48
[58] Field of Search ..................................... 377/47, 48

[56] References Cited

U.S. PATENT DOCUMENTS

| | | | |
|---|---|---|---|
| 4,063,070 | 12/1977 | Delarue et al. | 235/474 |
| 4,570,089 | 2/1986 | Nagano | 307/529 |
| 4,691,170 | 9/1987 | Riley | 377/47 |
| 4,773,031 | 9/1988 | Tobin | 377/47 |
| 4,870,684 | 9/1989 | Arai et al. | 381/7 |
| 4,956,797 | 9/1990 | Berard | 377/47 |

*Primary Examiner*—William L. Sikes
*Assistant Examiner*—Scott A. Ouellette
*Attorney, Agent, or Firm*—Ronald L. Taylor

[57] ABSTRACT

An improved direct digital frequency multiplier that multiplies input frequencies by a factor equal to the number of comparators in the circuit divided by two. The circuit includes a sensing stage, a ramping stage, a storage stage, a comparison stage and a logic stage. A signal containing the frequency to be multiplied is input to the sensing stage, which determines the frequency of the signal and outputs timing signals to the rest of the circuit. Coinciding with the period of the input signal, ramping voltages are generated, whose peak voltages are sampled and held for a specific time. The linearly ramping voltages are compared with the peak voltages and the comparison stage outputs voltage spikes to the logic stage. The logic stage combines the outputs from the comparison stage, and outputs a square wave signal possessing the appropriate multiplied frequency.

13 Claims, 2 Drawing Sheets

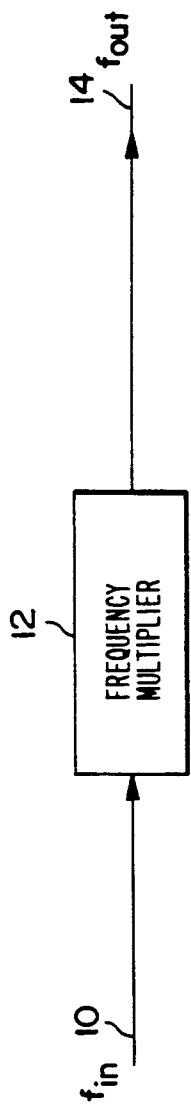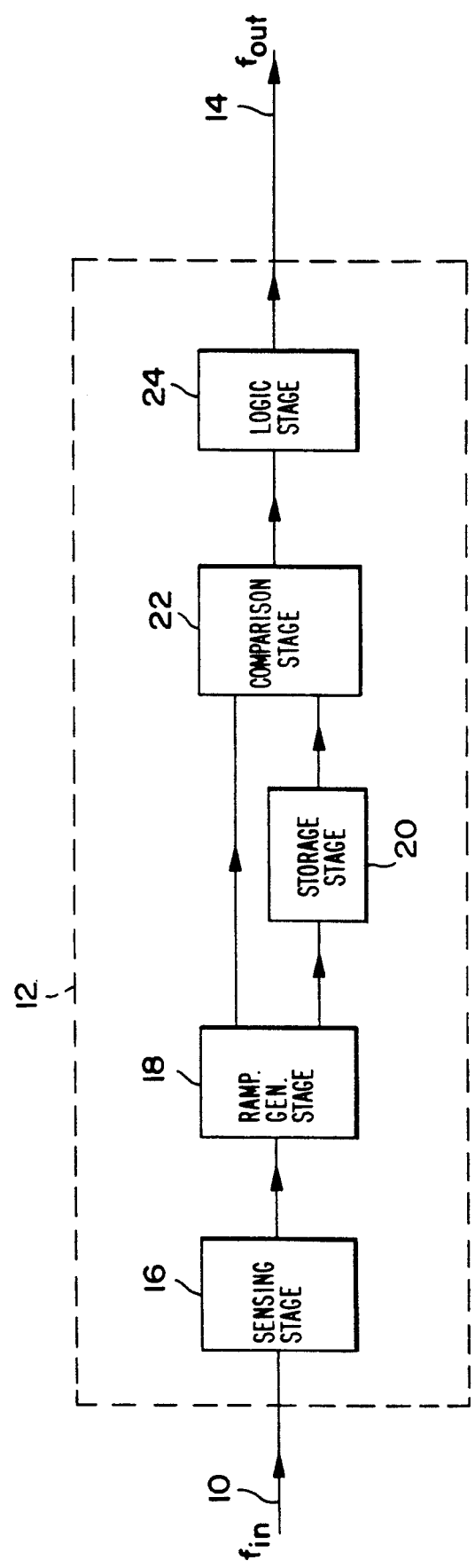

DIRECT DIGITAL FREQUENCY MULTIPLIER

BACKGROUND OF THE INVENTION

1. Field of the invention

This invention relates generally to a frequency multiplier for providing an output signal having a frequency greater than that of the frequency of the input signal, and more particularly to a direct digital frequency multiplier that multiplies frequencies by a predetermined factor.

2. Background of the invention

A frequency multiplier generates an output signal whose frequency is a multiple of the frequency of the input signal. Frequency multiplier circuits have a wide variety of uses, especially in generating high frequency signals. In electronics, for example, the manipulation of frequencies in the audio and radio frequency spectrum is often useful.

High frequency signals are more unstable and generate more interference than low frequency signals. Interference from the movement of high frequency signals is a most noticeable problem in integrated circuits, so much so that the function of the integrated circuit may be adversely affected. Therefore, it is advantageous to transmit low frequency signals across integrated circuits, and then to convert low frequencies to high frequencies only where needed. Reducing the presence of high frequency signals in an integrated circuit will lower the level of electromagnetic interference and likely reduce errors due to such interference.

Conventional frequency multiplier systems employ digital, analog, or a combination of both technologies. For example, in an analog frequency multiplier, an input signal is applied to a non-linear device that produces at its output a wide range of signals in a frequency spectrum whose components are integer multiples of the input frequency. A filter of predetermined center frequency is then positioned at the output of the non-linear device to select the desired frequency in the output signal frequency range.

Analog systems, however, are often less accurate than their digital counterparts. For example, analog frequency multipliers suffer from an inability to quickly and accurately respond to changes in input frequency and further, due to their inherent temperature sensitivity, may give poor performance when the temperature of the system is subject to change. Further, analog systems do not easily lend themselves to incorporation into LSI/MSI arrays.

U.S. Pat. No. 4,063,070 discloses a prior art frequency multiplier. However, the design disclosed therein has a slower response time since frequency changes require a full cycle interval. In addition, the function of this known multiplier can be improved.

SUMMARY OF THE INVENTION

In accordance with the present invention, a digital frequency multiplier is provided which generates an output frequency that is a desired predetermined multiple of an input frequency.

This direct digital frequency multiplier multiplies frequencies by a factor equal to the number of comparators in the circuit divided by two.

A signal possessing a certain frequency $f_{in}$ to be multiplied is input to the circuit. Dual ramp generators produce periodic linearly ramping signals on alternative halves of the input cycle. Each signal has a period equal to that of the input signal and a maximum magnitude which is directly related to $f_{in}$. A storage device then stores the maximum value of the ramping voltages. A resistor voltage divider is provided which produces a number of different voltage outputs, each voltage representing some fraction of the maximum voltage stored in the storage device. Each output is connected to an associated input of a comparator. Each comparator compares the voltage at its associated resistor voltage divider input with the instantaneous voltage magnitude of the ramping voltage and generates an appropriate output. These outputs are then combined in a logic device which, in turn, generates a periodic square wave possessing a frequency $f_{out}$ that is the desired multiple of $f_{in}$.

BRIEF DESCRIPTION OF THE DRAWINGS

Additional objects, advantages, and features of the present invention will become apparent from the following description and appended claims, taken in conjunction with the accompanying drawings in which:

FIG. 1 is a block diagram showing the overall function of the frequency multiplier of the present invention;

FIG. 2 is a block diagram of the circuit of the present invention; and

DETAILED DESCRIPTION OF THE PREFERRED EMBODIMENTS

Figure 3:
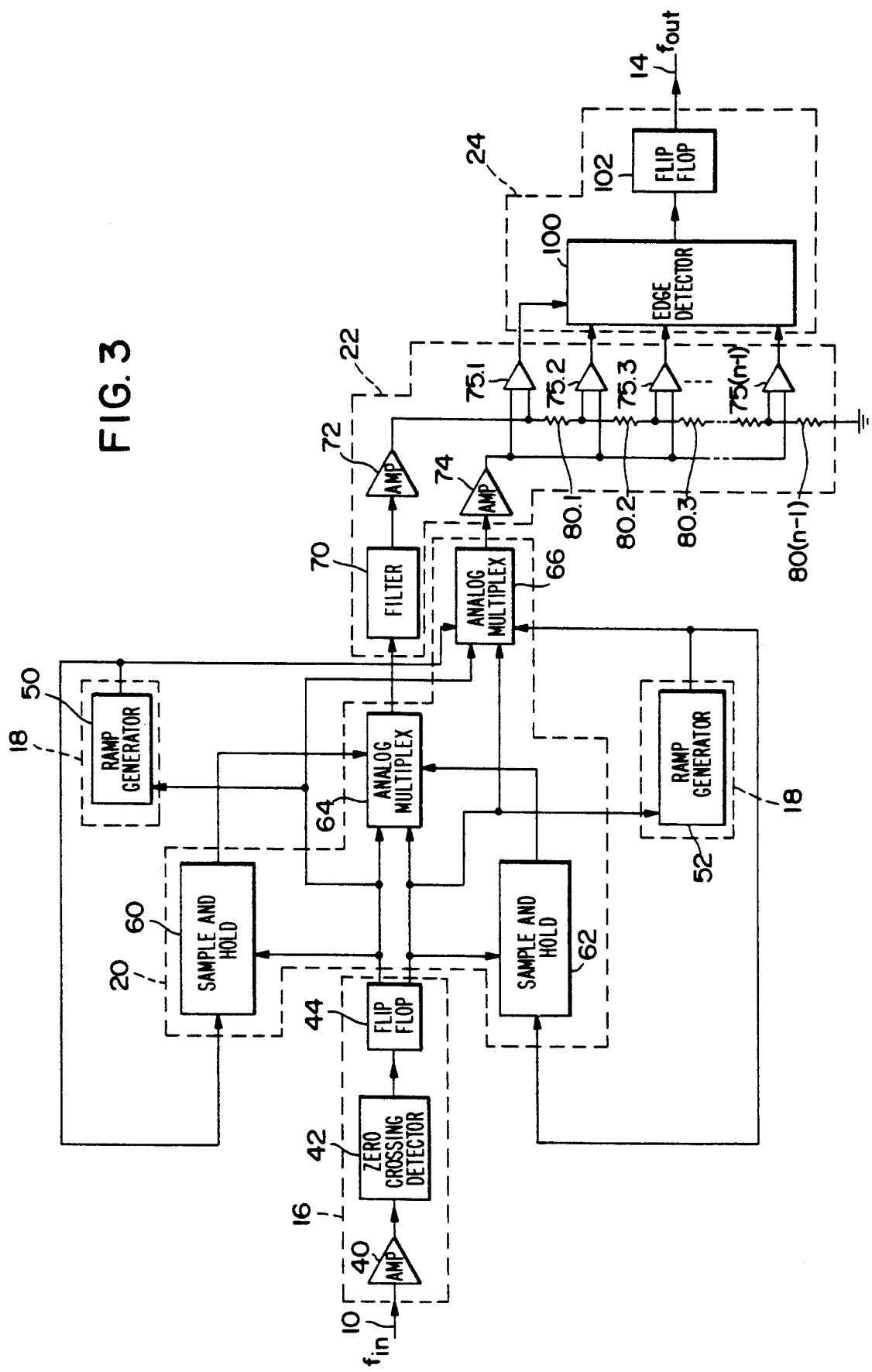
FIG. 3 is a schematic diagram of the components of the preferred embodiment of the frequency multiplier of this invention.

It should be understood that the following description of the preferred embodiment is merely exemplary in nature and is in no way intended to limit the invention of its application or uses.

Referring now to the drawings, FIG. 1. presents the overall function of the invention. In general, the frequency of an input signal 10 is multiplied by a frequency multiplier 12, which generates an output signal 14 that is a predetermined multiple of the input frequency.

Referencing FIG. 2, the frequency multiplier 12 contains a sensing stage 16, a ramping stage 18, a storage stage 20, a comparison stage 22, and a logic stage 24. An input signal 10 is connected to the sensing stage 16, which determines the frequency of the input signal and generates appropriate timing signals. The outputs of the sensing stage 16 are connected to the ramp generator stage 18, which generates positive ramping voltages. The peak of such voltage is stored in the storage stage 20, while the ramping stage is connected directly to the comparison stage 24. The comparison stage 24 compares the value stored in the storage stage 20 with the continually changing ramping voltage from the ramp generator stage 18, and outputs the correct signals. The logic stage 24 interprets the outputs from the comparison stage 22, and generates an output signal 14 with the appropriate multiplied frequency.

FIG. 3 shows a preferred embodiment of the frequency multiplier 12 of the present invention. The sensing stage 16 includes a unity gain amplifier 40, a zero crossing detector 42, and a flip-flop 44. The ramp generator stage 18 includes ramp generators 50 and 52. The storage stage 20 includes sample and hold 60 and 62, and analog multiplexers 64 and 66. The comparison stage 22 includes a filter 70, two unity gain amplifiers 72 and 74, a resistor voltage divider including a number of resistors 80.1, 80.2 . . . 80.(n), and a number of comparators 75.1, 75.2 ... 75.(n), where n is the number of comparators in the circuit. The logic stage 24 includes an edge detector 100 and a flip-flop 102.

The sensing stage 16 of FIG. 2. will now be more fully described. The sensing stage 16 includes unity gain amplifier 40, zero crossing detector 42, and flip-flop 44. The input signal 10 is connected to the unity gain amplifier 40 which stabilizes the input signal 10 and outputs the result to the zero crossing detector 42.

Zero crossing detector 42 determines the times at which the voltage of the input signal 10 crosses the zero voltage level, and generates an output signal at each instance. The zero crossing detector 42 effectively determines the period of the input signal 10 and outputs control signals corresponding to one-half period. The output of the zero crossing detector 42 is connected to flip-flop 44. Flip-flop 44 is the digital control for the entire circuit, outputting complimentary control signals that directly relate to the detection of zero-crossings. Flip-flop 44 outputs hence are responsive to changes of the frequency of the input signal 10.

The ramp generator stage 18 includes ramp generators 50 and 52. Ramp generators 50 and 52 are connected to the complimentary outputs of flip-flop 44. Ramp Generators 50 and 52 produce positive ramping voltages on alterative halves of the input cycle. The amplitude of the voltage signals and direction of the ramps depend on the current state of flip-flop 44. When flip-flop 44 receives a signal from zero crossing detector 42 indicating a half-period of input signal 10, flip-flop 44 will change state. This change in state will cause ramp generators 50 and 52 to cease ramping in one direction and begin ramping in the opposite direction, thereby creating sawtooth voltages. For example, if ramp generator 50 was outputting a linearly increasing voltage signal when flip-flop 44 changed state, ramp generator 50 would switch to outputting a decreasing voltage signal, therebycreating a peak voltage. The peak amplitude of the sawtooth voltage signals outputted from ramp generators 50 and 52 ultimately depend on the period of the input signal 10 is determined by the zero crossing detector 42.

Storage stage 20 includes sample and hold circuit 60 and 62, and analog multiplexers 64 and 66. Sample and hold circuit 60 is connected to one output of flip-flop 44 and to ramp generator 50. Sample and hold circuit 62 is connected to the complimentary output of flip-flop 44 and to ramp generator 52. Sample and hold circuits 60 and 62 sample the sawtooth voltages outputted by ramp generators 50 and 52 and store the maximum voltage amplitude of these signals. The voltages held by sample and hold circuits 60 and 62 are updated periodically, at a rate dependent on the incoming frequency of the signals originating from flip-flop 44.

Analog multiplex 64 is connected to the outputs of sample and hold circuits 60 and 62, and to the outputs of flip-flop 44. The peak voltage from sample and hold circuits 60 and 62 are input to analog multiplex 64, which selects the appropriate peak voltage corresponding to the timing signals received from flip-flop 44. Either the peak voltage from sample and hold circuit 60 or circuit 62 is selected and outputted to the comparison stage 22.

Analog multiplexer 66 is connected to the outputs of ramp generators 50 and 52, and to the outputs of flip-flop 44. The linearly ramping sawtooth voltages from ramp generators 50 and 52 are input to analog multiplexer 66, which selects an appropriate ramping voltage corresponding to the timing signals received from flip-flop 44. Either the ramping voltage from ramp generator 50 or 52 is selected and outputted to comparison stage 22.

Comparison stage 22 includes a number (n) of comparators 75.1, 75.2 ... 75.(n), an equal number of resistors 80.1, 80.2 ... 80.(n) as well as low pass filter 70 and unity gain amplifiers 72 and 74. The linearly ramping voltage output from analog multiplex 66 is connected to unity gain amplifier 74. Unity gain amplifier 74 supplies the current required to feed the capacitive and resistive load of the parallel comparator inputs as well as maintaining equal pipeline delay between the ramping voltages from ramp generators 50, 52 and sample and hold circuits 60, 62. The output of unity gain amplifier 74 is connected to one input of the comparators. The peak voltage output of analog multiplex 64 is connected to low pass filter 70, which removes glitches that could be generated during the multiplex process. The output of low pass filter 70 is connected to unity gain amplifier 72, which acts as a buffer, and then to second inputs of the comparators.

The n resistors 80.1, 80.2 ... 80.(n), making up the resistor voltage divider are positioned such that the peak voltage of the sawtooth signal from analog multiplex 64 is applied to the top of the resistor chain. Each resistor is connected between the second inputs of each comparator. Only the first comparator 75.1 receives as one input the full peak voltage from analog multiplex 64. Due to the effect of the resistor voltage divider, the second inputs of the remaining comparators receive as inputs predetermined fractions of the peak voltage.

Each comparator 75.1, 75.2 ... 75.(n) compares the linearly ramping voltage from analog multiplex 66 appearing at the comparators, first input with the peak voltage components, arising from the resistor voltage divider, impressed on their second inputs. As the voltage ramp crosses the comparators' reference voltage taken from the resistor voltage divider, each comparator generates an output transition in sequence from the lowest to the highest in the voltage chain. These outputs are then connected to logic stage 24.

Logic stage 24 includes edge detector 100 and flip-flop 102. The edge detector 100 is connected to the outputs of the comparators 75.1, 75.2 ... 75.(n). The flip-flop 102 is coupled to the output of edge detector 100. The outputs of the n comparators are combined in the edge detector as voltage spikes. The voltage spikes are fed to flip-flop 102 which converts the spikes to a square wave whose frequency is equal to the number of comparators in the circuit divided by two times $f_{in}$.

The present invention can be implemented with discrete components, but optimal performance is obtained by implementing it as an integrated circuit using a technology specifically designed for analog to digital conversion.

There are many advantages of the present invention. For example, the output frequency multiplication is set independent of the input frequency. Therefore, this frequency multiplier can be utilized in situations requiring any specific integer multiple of an input frequency. Further, frequency changes require only half cycle intervals thus leading to faster response times. Since spurious harmonics are suppressed, this circuit will function with minimal error.

While this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A frequency multiplier, comprising:
   input means, connected to an input signal whose frequency is to be multiplied;
   sensing means, coupled to said input means, for sensing the frequency of said input signal;
   dual ramp generator means, coupled to said sensing means, for producing a sawtooth voltage signal on alternative halves of a period of said input signal thereby providing a frequency of at least twice the input frequency;
   storage means, coupled to said ramp generator means, for storing a peak voltage of said sawtooth voltage;
   comparison means, coupled to said ramp generator means and said storage means, for comparing an instantaneous magnitude of said sawtooth voltage with said peak voltage and creating an output voltage transition; and
   logic means, coupled to said comparison means, for producing an output signal whose frequency is a desired multiple of said input signal frequency as a function of the magnitude of said output voltage transition of said comparison means.

2. The frequency multiplier, according to claim 1, wherein said sensing means comprises:
   a first unity gain amplifier connected to said input signal;
   a zero crossing detector coupled to said amplifier; and
   a first flip-flop connected to said zero crossing detector.

3. The frequency multiplier, according to claim 2, wherein said ramp generator means comprises:
   a first ramp generator connected to a first output of said first flip-flop; and
   a second ramp generator connected to a second output of said first flip flop.

4. The frequency multiplier, according to claim 3, wherein said storage means comprises:
   a first sample and hold circuit coupled to a first output of said first flip-flop and to an output of said first ramp generator;
   a second sample and hold circuit coupled to a second output of said first flip-flop and to an output of said second ramp generator; and
   a first analog multiplexer coupled to outputs of said first and second sample and hold circuits and to said first and second outputs of said first flip-flop; and p1 a second analog multiplexer coupled to the outputs of said first and second ramp generators and to said first and second outputs of said flip flop.

5. The frequency multiplier, according to claim 4, wherein said comparison means comprises:
   a filter connected to said storage means, outputting a signal to a second amplifier;
   a resistor voltage divider coupled to said second amplifier, said resistor voltage divider including a number of resistors, each resistor providing an output representing a voltage magnitude which is a predetermined fraction of said stored peak voltage; and
   a plurality of comparators, each comparator coupled to an output of said resistor voltage divider and to said ramp generator means, said ramp generator means being first passed through a third amplifier; and
   wherein said comparators generate a number of pulse signal outputs during said period of said input signal.

6. The frequency multiplier, according to claim 5, wherein said logic means comprises:
   an edge detector coupled to the signal outputs of said comparators; and
   a second flip-flop coupled to an output of said edge detector, outputting a signal with the desired multiplied frequency.

7. A method of converting an input signal of a first frequency to an output signal of a second frequency, said second frequency being greater than said first frequency by a factor of N/2, and N>1, where N is the number of comparators in a circuit, said method comprising the steps of:
   a. inputting the input signal of said first frequency to a sensing means and outputting complementary signals unchanged in frequency;
   b. generating positive ramp voltages in first and second ramp generators on alternative halves of a period of said input signal, thereby providing a frequency of at least twice the input frequency, magnitudes of said voltages varying between a reference magnitude and a maximum magnitude which is related to said first frequency to be multiplied;
   c. storing a peak voltage of said positive ramp voltages in first and second sample and hold circuits;
   d. selecting an output from said first and second sample and hold circuits;
   e. feeding said selected stored peak voltage to a resistor voltage divider;
   f. selecting a positive ramp voltage output from said first and second ramp generators;
   g. coupling said selected output of said first and second ramp generators to a first input of a number of comparators;
   h. connecting said resistor voltage divider to a second input of said number of comparators, such that said second input of each said comparator is coupled to different voltage levels;
   i. comparing voltages at said first and second inputs of said comparators, and generator appropriate outputs; and
   j. connecting said outputs from said comparators to a logic means; and
   k. using the logic means for producing an output signal whose frequency is a desired multiple of said input frequency as a function of the number of comparators in said circuit.

8. The method of claim 7, wherein step a. further comprises:
   stabilizing the input signal by feeding said input signal through a first unity gain amplifier;
   determining the frequency of said input signal by connecting said input signal to a zero crossing detector, and outputting an appropriate pulse signal to a first flip flop; and
   generating alternative voltage timing signals from complimentary outputs of said first flip-flop.

9. The method of claim 8, wherein steps d. and e. further comprise:

inputting a peak voltage from said first and second sample and hold circuits to a first analog multiplexer;

triggering said first analog multiplexer to select an output from said first or second sample and hold circuits depending on timing signals received from said first flip flop;

coupling the output of said first analog multiplexer to a filter and second unity gain amplifier; and generating an appropriate reference voltage to be input to said resistor voltage divider.

10. The method of claim 8, wherein step f. further comprises:

inputting said output from said first and second ramp generators to a second analog multiplexer; and triggering said second analog multiplexer to select an output from said first or second ramp generators depending on timing signals received from said first flip flop.

11. The method of claim 7, wherein step h. further comprises:

generating a number of voltage levels, each voltage representing a certain fraction of said stored peak voltage; and coupling said number of voltage levels to said second inputs of said number of comparators.

12. The method of claim 7, wherein step i. further comprises:

generating a first level signal when an instantaneous magnitude of said ramp voltages is greater than a voltage at an associated resistor divider input to said comparators; and generating a second level signal when the instantaneous magnitude of said ramp voltages is less than the voltage at the associated resistor divided input to said comparators.

13. The method of claim 7, wherein steps j. and k. further comprise:

combining said outputs of said comparators in an edge detector, wherein such edge detector outputs voltage spikes;

coupling the output of said edge detector to a second flip flop; and outputting a signal whose frequency is an appropriate multiple of the input frequency.

* * * * *